United States Patent [19]
Zhou et al.

[11] Patent Number: 5,792,708
[45] Date of Patent: Aug. 11, 1998

[54] METHOD FOR FORMING RESIDUE FREE PATTERNED POLYSILICON LAYERS UPON HIGH STEP HEIGHT INTEGRATED CIRCUIT SUBSTRATES

[75] Inventors: Mei Sheng Zhou; Lap Chan; Young-Tong Tsai, all of Singapore, Singapore

[73] Assignee: Chartered Semiconductor Manufacturing Pte Ltd., Singapore, Singapore

[21] Appl. No.: 611,585

[22] Filed: Mar. 6, 1996

[51] Int. Cl.⁶ .................................................. H01L 21/08
[52] U.S. Cl. ...................... 438/647; 438/657; 438/669; 438/684; 438/719
[58] Field of Search ........................ 437/186, 193, 437/195, 228; 156/662.1; 438/647, 657, 669, 684, 719

[56] References Cited

U.S. PATENT DOCUMENTS

| | | | |
|---|---|---|---|
| 4,702,000 | 10/1987 | Matlock et al. | 437/63 |
| 4,795,718 | 1/1989 | Beitman | 437/41 |
| 4,981,809 | 1/1991 | Mitsuaki et al. | 437/41 |
| 5,242,536 | 9/1993 | Schoenborn | 156/643 |
| 5,342,801 | 8/1994 | Perry et al. | 437/52 |
| 5,371,025 | 12/1994 | Sung | 437/41 |
| 5,449,433 | 9/1995 | Donohoe | 156/643.1 |
| 5,504,704 | 4/1996 | Sato et al. | 365/182 |
| 5,550,072 | 8/1996 | Cacharelis et al. | 437/43 |
| 5,550,085 | 8/1996 | Liu | 437/203 |
| 5,595,935 | 1/1997 | Chan et al. | 437/193 |

OTHER PUBLICATIONS

S.M. Sze, "VLSI Technology", McGraw Hill Book Co. Singapore (1986) pp. 221–222.

*Primary Examiner*—John Niebling
*Assistant Examiner*—Thomas G. Bilodean
*Attorney, Agent, or Firm*—George O. Saile; Stephen B. Ackerman; Alek P. Szecsy

[57] ABSTRACT

A method for forming a residue free patterned polysilicon layer upon a high step height patterned substrate layer. First, there is provided a semiconductor substrate having formed thereon a high step height patterned substrate layer. Formed upon the high step height patterned substrate layer is a polysilicon layer, and formed upon the polysilicon layer is a patterned photoresist layer. The patterned photoresist layer exposes portions of the polysilicon layer at a lower step level of the high step height patterned substrate layer. The polysilicon layer is then patterned through the patterned photoresist layer as an etch mask employing an anisotropic first etch process to yield a patterned polysilicon layer upon the surface of the high step height patterned substrate layer and polysilicon residues at the lower step level of the high step height patterned substrate layer. The anisotropic first etch process is a Reactive Ion Etch (RIE) anisotropic first etch process which simultaneously passivates the exposed sidewall edges of the patterned polysilicon layer. Finally, the polysilicon residues formed at the lower step level of the high step height patterned substrate layer are removed through an isotropic second etch process. The isotropic second etch process is a Reactive Ion Etch (RIE) isotropic second etch process which employs hydrogen bromide (HBr) and sulfur hexafluoride (SF6) as the reactant gases.

23 Claims, 5 Drawing Sheets

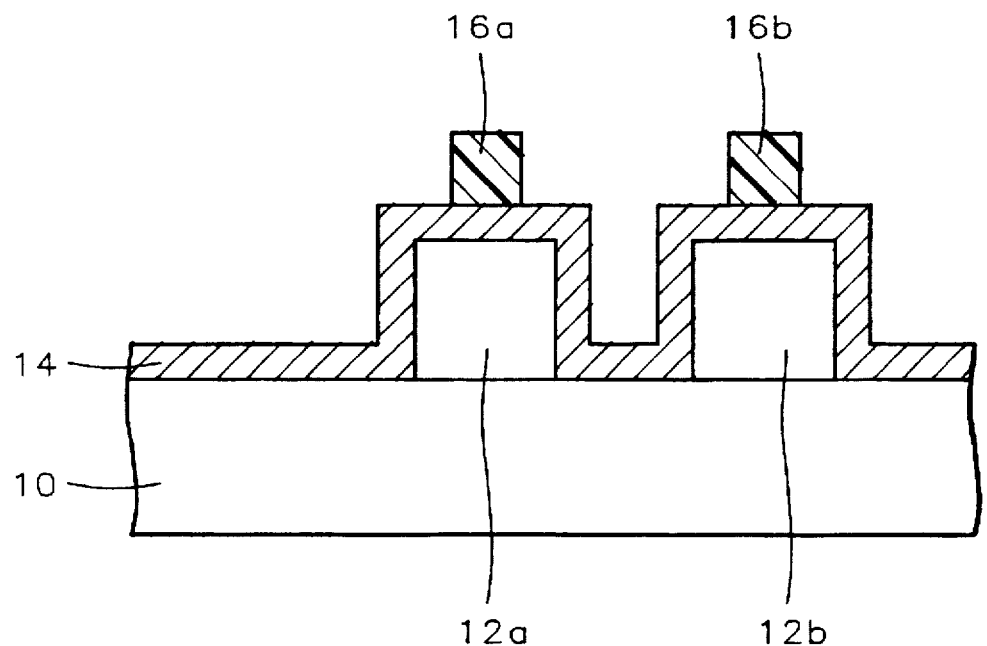
FIG. 1 – Prior Art
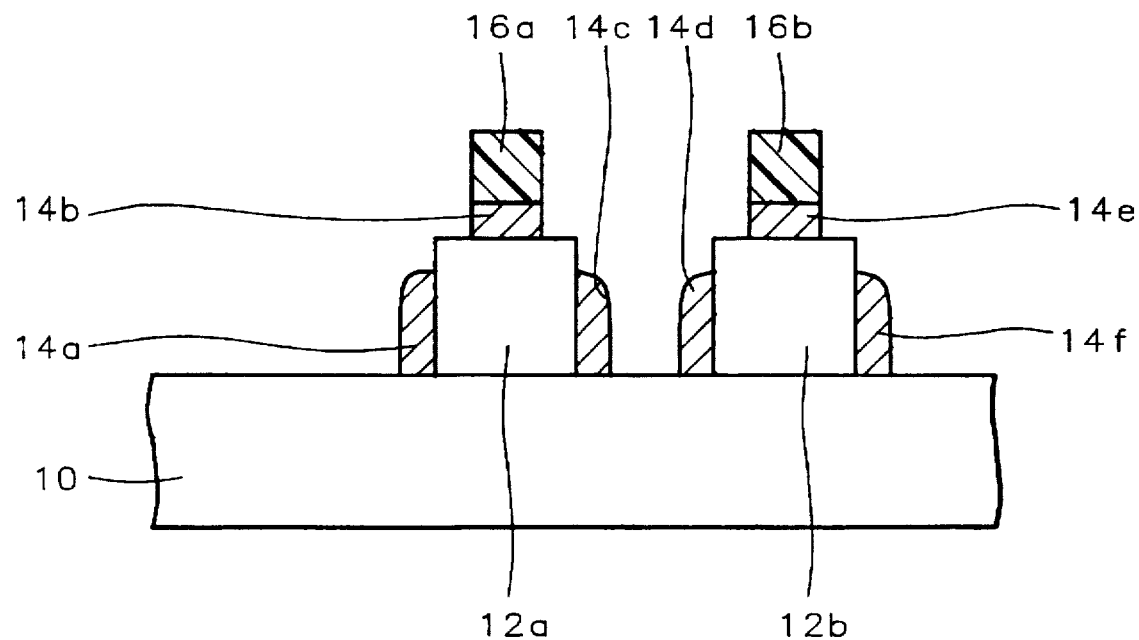
FIG. 2 – Prior Art

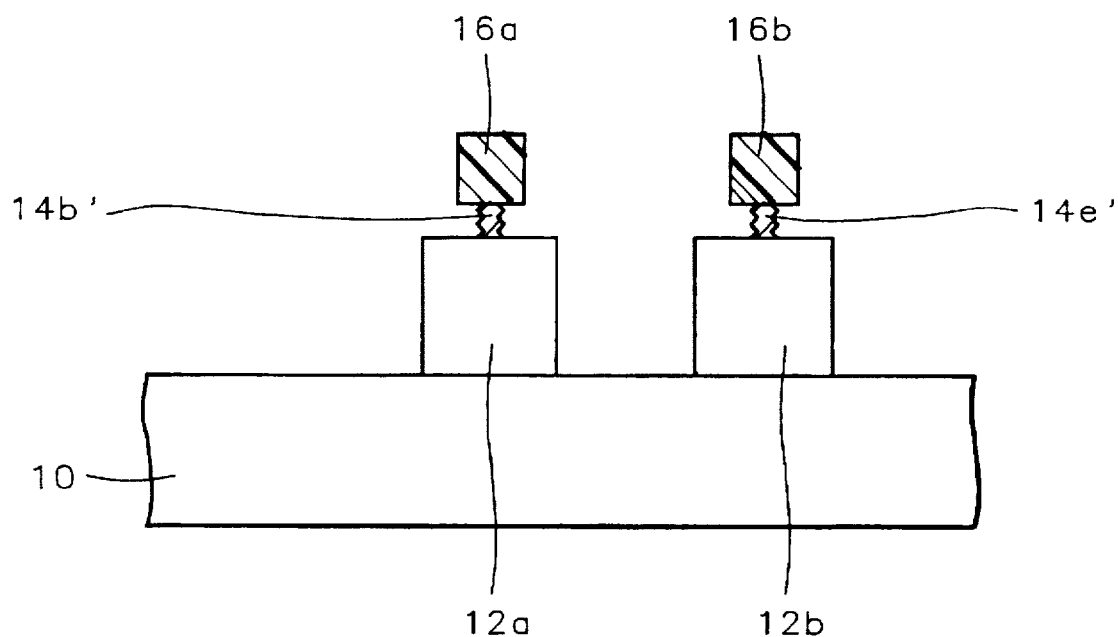
*FIG. 3 - Prior Art*
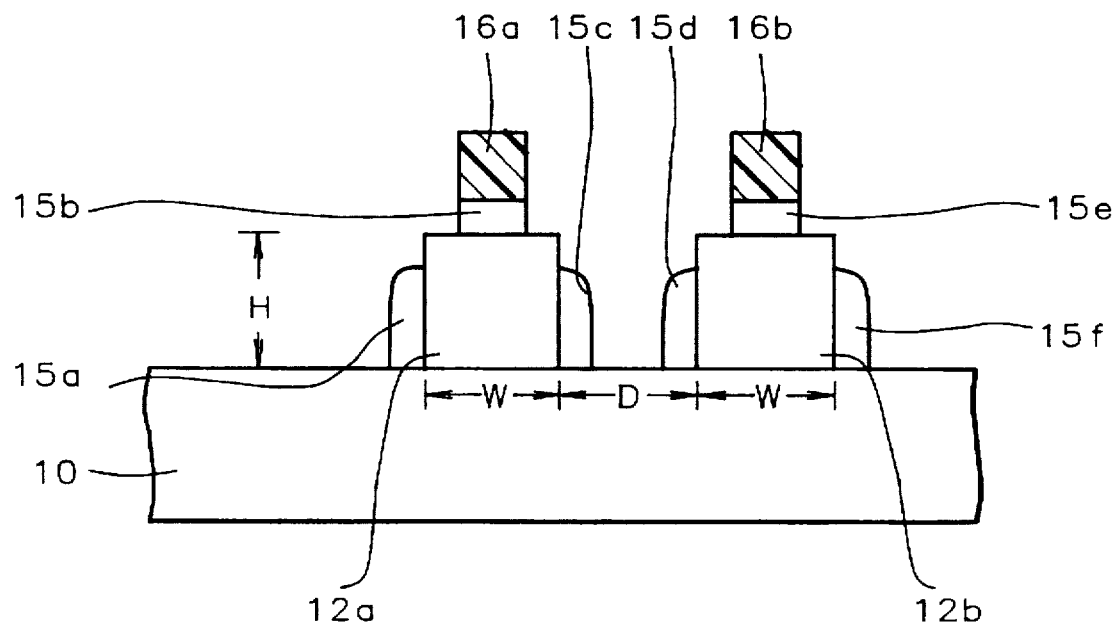
*FIG. 4*

5,792,708

1

METHOD FOR FORMING RESIDUE FREE PATTERNED POLYSILICON LAYERS UPON HIGH STEP HEIGHT INTEGRATED CIRCUIT SUBSTRATES

BACKGROUND OF THE INVENTION

1. Field of the Invention

The present invention relates generally to methods for forming patterned polysilicon layers within integrated circuits. More particularly, the present invention relates to methods for forming residue free patterned polysilicon layers upon high step height patterned substrate layers within integrated circuits.

2. Description of the Related Art

As integrated circuit technology has progressed towards increasingly higher levels of integration, line-widths and spacings within advanced integrated circuits have become increasingly narrower while aspect ratios of structures within advanced integrated circuits have become increasingly higher. In addition to characteristics which relate directly to the size and spacing of structures within advanced integrated circuits, it is also common that structures within advanced integrated circuits are formed upon substrate layers which have significant topographic differentials, such as substantial step height variations. The sum of these factors often impedes production of fully functional and reliable patterned structures, such as patterned polysilicon structures, within advanced integrated circuits.

One of the more common defects which often occurs when photo-lithographically forming patterned structures upon high step height patterned substrate layers within integrated circuits is the simultaneous formation of undesirable patterned structure residues at lower step levels of the high step height substrate layers. The results of this defect are illustrated, in general, by reference to FIG. 1 and FIG. 2. Shown in FIG. 1 is a blanket substrate layer 10 upon which is formed a pair of high step height patterned substrate layers 12a and 12b. Upon the exposed surfaces of the blanket substrate layer 10 and the high step height patterned substrate layers 12a and 12b is formed a blanket conformal layer 14 which is typically, although not exclusively, a blanket conformal layer 14 of a conductor material, such as, but not limited to, a polysilicon conductor material. Formed upon portions of the blanket conformal layer 14 residing above the high step height patterned substrate layers 12a and 12b, respectively, are patterned photoresist layers 16a and 16b.

As shown in FIG. 2, upon anisotropic etching of the blanket conformal layer 14 employing the patterned photoresist layers 16a and 16b as an etch mask, there is formed the desired patterned conformal layers 14b and 14e, and the undesired conformal layer residues 14a, 14c, 14d and 14f. Typically, although not exclusively, the anisotropic etching is accomplished through an anisotropic Reactive Ion Etch (RIE) plasma etch method. The presence of the undesired conformal layer residues 14a, 14c, 14d and 14f, when formed of a conductor material, may lead to electrical shorts and bridging. It is thus in general towards the goal of removing undesired residues, such as undesired conformal layer residues 14a, 14c, 14d and 14f, while simultaneously preserving the dimensions and integrity of patterned layers, such as the patterned conformal layers 14b and 14e, that the present invention is directed.

Although it is, in general, possible to remove undesired residues from lower step levels within an integrated circuit through either a more vigorous anisotropic etching or an isotropic etching of those undesired residues, such additional etching will typically substantially over-etch, erode or otherwise damage the edges of the patterned conformal layer exposed beneath a photoresist etch mask while simultaneously removing the undesired conformal layer residues. The results of such over-etching, within the context of the structures illustrated within FIG. 1 and FIG. 2, are shown in FIG. 3. Shown within FIG. 3 are the over-etched patterned conformal layers 14b' and 14e'. Under circumstances where the high step height patterned substrate layers 12a and 12b, and patterned photoresist layers 16a and 16b, are particularly narrow, the extent of over-etching, erosion or damage may yield over-etched patterned conformal layers 14b' and 14e' which are sufficiently over-etched such that a functional or reliable integrated circuit is not formed.

Methods through which patterned structures within integrated circuits may be protected from deterioration due to exposure to integrated circuit processing operations are known in the art. For example, Beitman, in U.S. Pat. No. 4,795,718 discloses a method for manufacturing an Insulated Gate Field Effect Transistor (IGFET) having self-aligned source/drain contact regions. The method employs forming a low melting point dielectric layer over the gate electrode of the IGFET device and heating the dielectric until it covers and encapsulates the gate electrode of the IGFET. The self-aligned source/drain contacts may then be formed without shorting to the gate electrode.

Although not directed towards the goal of encapsulating delicate integrated circuit structures, Mitsuaki et al., in U.S. Pat. No. 4,981,809 describe a related method for forming fine mask patterns for use in producing advanced transistors. The method employs a patterned photoresist layer formed and subsequently annealed upon a semiconductor substrate. The annealing process reflows the patterned photoresist layer and forms smaller openings within the photoresist pattern. The smaller openings yield a fine mask pattern which is useful in forming advanced transistors.

Although also not directed towards the goal of encapsulating delicate integrated circuit structures, S. M. Sze, in VLSI Technology, (McGraw Hill Book Co., Singapore (1986)) pp. 221-222 discloses materials through which polysilicon and polycide (polysilicon/metal silicide stack) layers may be etched in a Reactive Ion Etch (RIE) plasma.

In addition, Sung, in U.S. Pat. No. 5,371,025 describes a method for making Thin Film Transistors (TFTs) for use within Liquid Crystal Displays (LCDs). The method employs a patterned photoresist layer formed upon a gate electrode, which patterned photoresist layer is subsequently thermally re-flowed to form a mask which prevents channel overlap between the gate electrode and the source/drain electrodes of the Thin Film Transistor (TFT). Thin Film Transistors (TFTs) which have limited channel overlap exhibit a higher signal to noise ratio. Thus, they produce higher quality Liquid Crystal Displays (LCDs).

Finally, there is disclosed within a related co-assigned application an alternative method for addressing problems analogous to the problem to which the present invention is directed. See, Chan et al., "Method for Forming Residue Free Patterned Conductor Layers Upon High Step Height Integrated Circuit Substrates Using Reflow of Photoresist," application Ser. No. 08/579,165, filed Dec. 27, 1995, now U.S. Pat. No. 5,618,384. The disclosure describes a method for reflowing patterned photoresist layers to encapsulate exposed edges of patterned conductor layers upon high step height integrated circuit substrates. Conductor layer residues may then be removed from lower step levels of those integrated circuit substrates without damaging the patterned conductor layers.

Desirable in the art are additional methods for removing undesired residues from lower step levels of high step height substrate layers while simultaneously avoiding damage to patterned layers formed upon upper step levels of the high step height substrate layers. Particularly desirable are additional methods which may be employed in-situ for removing undesired polysilicon residues while simultaneously avoiding damage to patterned polysilicon layers.

SUMMARY OF THE INVENTION

A first object of the present invention is to provide a method for removing undesired polysilicon residues from lower step levels of high step height patterned substrate layers within integrated circuits while simultaneously avoiding damage to patterned polysilicon layers formed upon upper step levels of the high step height patterned substrate layers.

A second object of the present invention is to provide a method in accord with the first object of the present invention, which method may be employed in-situ.

A third object of the present invention is to provide a method in accord with the first object of the present invention and the second object of the present invention, which method is also manufacturable.

In accord with the objects of the present invention there is provided a method for removing undesired polysilicon residues from lower step levels of high step height patterned substrate layers within integrated circuits while simultaneously avoiding damage to patterned polysilicon layers formed upon upper step levels of the high step height substrate layers. To practice the method of the present invention, there is first provided a substrate having formed thereon a high step height patterned substrate layer. Formed upon the high step height patterned substrate layer is a polysilicon layer, and formed upon the polysilicon layer is a patterned photoresist layer. The patterned photoresist layer exposes portions of the polysilicon layer at a lower step level of the high step height patterned substrate layer. The polysilicon layer is then patterned employing the patterned photoresist layer as an etch mask via an anisotropic first etch process to yield a patterned polysilicon layer upon the surface of the high step height patterned substrate layer and polysilicon residues at the lower step level of the high step height patterned substrate layer. The anisotropic first etch process is a Reactive Ion Etch (RIE) anisotropic first etch process which simultaneously passivates the exposed edges of the patterned polysilicon layer. Finally, the polysilicon residues formed at the lower step level of the high step height patterned substrate layer are removed through an isotropic second etch process. The isotropic second etch process is a Reactive Ion Etch (RIE) isotropic second etch process which employs hydrogen bromide (HBr) and sulfur hexafluoride (SF6) as reactant gases.

The present invention provides a method for removing undesired polysilicon layer residues from lower step levels of high step height patterned substrate layers while simultaneously avoiding damage to patterned polysilicon layers formed upon upper step levels of the high step height patterned substrate layers. Through the method of the present invention, exposed sidewall edges of a patterned polysilicon layer are simultaneously passivated through a Reactive Ion Etch (RIE) anisotropic first etch process which is employed in forming the patterned polysilicon layer. Polysilicon layer residues which reside at lower step levels of the high step height patterned substrate layer may be removed through a Reactive Ion Etch (RIE) isotropic second etch process which contains hydrogen bromide (HBr) as a reactant gas, while not damaging the exposed edges of the patterned polysilicon layers. The hydrogen bromide (HBr) provides additional in-situ passivation of the exposed sidewall edges of the patterned polysilicon layers while the polysilicon layer residues are removed.

The present invention provides a readily manufacturable method which may be employed in-situ in removing polysilicon layer residues from lower step levels of high step height patterned substrate layers within integrated circuits. upon the upper levels of which high step height patterned substrate layers are formed patterned polysilicon layers. The method of the present invention provides a Reactive Ion Etch (RIE) anisotropic first etch process followed by a Reactive Ion Etch (RIE) isotropic second etch process. Since both the first etch process and the second etch process are Reactive Ion Etch (RIE) etch processes, the present invention provides a readily manufacturable method which may be employed in-situ by sequentially varying the reactant gases and process conditions employed in the first etch process and the second etch process.

BRIEF DESCRIPTION OF THE DRAWINGS

The following drawings, which form a material part of this disclosure, show the following:

FIG. 1 to FIG. 3 show a series of schematic cross-sectional schematic diagrams which illustrate progressive stages in forming residue free patterned layers upon high step height patterned substrate layers through a method of the prior art.

FIG. 4 and FIG. 5 show a pair of schematic cross-sectional diagrams illustrating progressive stages in forming residue free patterned polysilicon layers upon high step height patterned substrate layers in accord with the first preferred embodiment of the present invention.

DETAILED DESCRIPTION OF THE PREFERRED EMBODIMENTS

The present invention provides a method for forming residue free patterned polysilicon layers upon high step height patterned substrate layers within an integrated circuit, while simultaneously preserving the integrity of the patterned polysilicon layers. In order to accomplish this goal, the preferred embodiments of the present invention provide a two step Reactive Ion Etch (RIE) plasma etch method. Within the first step there is provided a Reactive Ion Etch (RIE) anisotropic first etch process through which the exposed sidewall edges of a patterned polysilicon layer formed upon a high step height patterned substrate layer are passivated when the patterned polysilicon layer is patterned from a polysilicon layer. Simultaneous with patterning of the polysilicon layer there is formed at lower step levels of the high step height patterned substrate layers undesired polysilicon layer residues. Within the second step of the two step Reactive Ion Etch (RIE) plasma etch method there is provided a Reactive Ion Etch (RIE) isotropic second etch process through which the undesired polysilicon layer residues are removed without over-etching, eroding or otherwise damaging the patterned polysilicon layers. The Reactive Ion Etch (RIE) isotropic second etch process employs hydrogen bromide (HBr) and sulfur hexafluoride (SF6) as reactant gases.

The present invention may be practiced in forming residue free patterned polysilicon layers upon any high step height patterned substrate layer of sufficiently high step height such that polysilicon layer residues are routinely formed when polysilicon layers upon the high step height patterned substrate layer are patterned into patterned polysilicon layers when employing an anisotropic etch process and a patterned photoresist etch mask. The method of the present invention may be employed in forming residue free patterned polysilicon layers within integrated circuits including but not limited to Static Random Access Memory (SRAM) integrated circuits. Dynamic Random Access Memory (DRAM) integrated circuits. Application Specific Integrated Circuits (ASICs), integrated circuits having within their fabrications Field Effect Transistors (FETs) and integrated circuits having within their constructions bipolar transistors. The method of the present invention has broad applicability in forming within integrated circuits dimensionally stable residue free patterned polysilicon layers.

Figure 5:
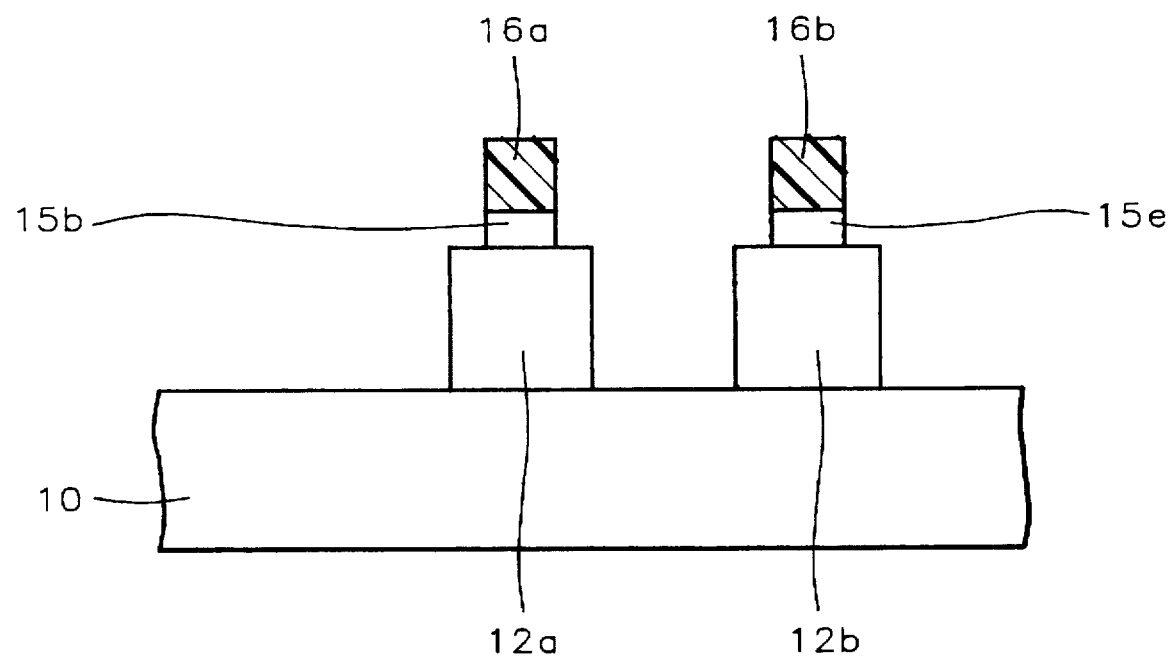

Referring now to FIG. 4 and FIG. 5, there is shown a pair of schematic cross-sectional diagrams illustrating the results of progressive stages in forming residue free patterned polysilicon layers upon high step height patterned substrate layers in accord with the first preferred embodiment of the present invention. The first preferred embodiment of the present invention is a general embodiment of the present invention which follows analogously from the prior art as illustrated by reference to FIG. 1 to FIG. 3.

The structure illustrated in FIG. 4 correlates with the structure illustrated in FIG. 2, with the exceptions that: (1) the patterned conformal layers 14b and 14e illustrated in FIG. 2 have been replaced with patterned polysilicon layers 15b and 15e, and (2) the conformal layer residues 14a, 14c, 14d and 14f illustrated in FIG. 2 have been replaced with conformal polysilicon layer residues 15a, 15c, 15d and 15f. The blanket substrate layer 10, the high step height patterned substrate layers 12a and 12b, and the patterned photoresist layers 16a and 16b remain the same.

Practice of the present invention provides most value when the step height, H, of the high step height patterned substrate layers 12a and 12b is substantial in comparison with conventional integrated circuits. Preferably, the step height, H, is at least about 3000 angstroms. Less significant in the practice of the present invention are the individual widths, W, of the high step height patterned substrate layers 12a and 12b, and the distance, D, separating those layers. Typically the widths, W, of the high step height patterned layers 12a and 12b are greater than about 5000 angstroms each, and the distance, D, separating those layers is at least about 2000 angstroms.

Although the high step height patterned substrate layers 12a and 12b may be formed of materials including but not limited to conductor materials, insulator materials and semiconductor materials, the high step height patterned substrate layers 12a and 12b are typically and preferably formed of insulator materials. It is preferred and desirable in practice of the present invention that the blanket substrate layer 10 and the high step height patterned substrate layers 12a and 12b be formed of materials, or composites of materials, which have a low etch selectivity to the multiple etch processes to which those layers are exposed through the method of the present invention.

Analogously with the prior art, the patterned polysilicon layers 15b and 15e, and the conformal polysilicon layer residues 15a, 15c, 15d and 15f are also formed through anisotropic Reactive Ion Etch (RIE) plasma etching, albeit of a blanket conformal polysilicon layer. The blanket conformal polysilicon layer may be formed upon the exposed surfaces of the blanket substrate layer 10 and the high step height patterned substrate layers 12a and 12b through methods as are conventional in the art, including but not limited to Chemical Vapor Deposition (CVD) methods, Low Pressure Chemical Vapor Deposition (LPCVD) methods and Physical Vapor Deposition (PVD) sputtering methods. Typically, although not exclusively, the blanket conformal polysilicon layer will also be made conductive through incorporation of a suitable type and amount of dopant, through methods as are conventional in the art. Typically, the thickness of the blanket polysilicon layer is from about 200 to about 4000 angstroms.

Also shown in FIG. 4 is the presence of the patterned photoresist layers 16a and 16b. The composition of the patterned photoresist layers 16a and 16b is typically not critical to practice of the present invention. Thus, the patterned photoresist layers 16a and 16b may be formed from any of several photoresist materials which are conventional in the art. Analogously with the blanket substrate layer 10 and the high step height patterned substrate layers 12a and 12b, it is preferred in the present invention that the photoresist material from which is formed the patterned photoresist layers 16a and 16b be a photoresist material that is not susceptible to substantial degradation through exposure to the multiple etch processes to which the patterned photoresist layers 16a and 16b are exposed. Preferably, the patterned photoresist layers 16a and 16b are from about 4000 to about 30000 angstroms thick each.

In order to arrive at the structure illustrated in FIG. 4, the blanket conformal polysilicon layer from which is formed the patterned polysilicon layers 15b and 15e, and the polysilicon layer residues 15a, 15c, 15d and 15f, is etched through a Reactive Ion Etch (RIE) anisotropic first etch process. The Reactive Ion Etch (RIE) anisotropic first etch process employs a Reactive Ion Etch (RIE) plasma which simultaneously passivates the exposed sidewall edges of the patterned polysilicon layers 15b and 15e as the patterned polysilicon layers 15b and 15e are formed from the blanket conformal polysilicon layer.

It has been found experimentally that a chlorine (Cl2) and hydrogen bromide (HBr) containing Reactive Ion Etch (RIE) plasma will provide the desired passivation to the exposed sidewall edges of the patterned polysilicon layers 15b and 15e. Preferably, the chlorine (Cl2) and hydrogen bromide (HBr) containing Reactive Ion Etch (RIE) plasma is provided at a chlorine:hydrogen bromide volume ratio of from about 10:1 to about 2:1.

Other parameters under which is provided the chlorine (Cl2) and hydrogen bromide (HBr) containing Reactive Ion Etch (RIE) plasma include a reactor chamber pressure of from about 220 to about 330 mtorr, a radio frequency power of from about 170 to 260 watts, a background helium (He) flow rate of from about 140 to about 250 standard cubic centimeters per minute (sccm) and a total chlorine (Cl2) and hydrogen bromide (HBr) flow rate of from about 170 to about 280 standard cubic centimeters per minute (sccm). The blanket conformal polysilicon layer from which is formed the patterned polysilicon layers 15b and 15e is exposed to the chlorine (Cl2) and hydrogen bromide (HBr) containing Reactive Ion Etch (RIE) anisotropic first etch process for a time period sufficient to: (1) completely etch the patterned polysilicon layers 15b and 15e from the blanket conformal polysilicon layer, and (2) sufficiently passivate the sidewall edges of the patterned polysilicon layers 15b and 15e. Typically, the etch time will be from about 100 to about 180 seconds.

Referring now to FIG. 5, there is shown a schematic cross-sectional diagram illustrating the results of further processing of the structure whose cross-sectional schematic diagram is illustrated in FIG. 4. Absent from the structure whose cross-sectional diagram is illustrated by FIG. 5 are the conformal polysilicon layer residues 15a, 15c, 15d and 15f. The conformal polysilicon layer residues 15a, 15c, 15d and 15f are removed through a Reactive Ion Etch (RIE) isotropic second etch process. In contrast with the prior art as illustrated within FIG. 3, the conformal polysilicon layer residues 15a, 15c, 15d and 15f are removed without over-etching, eroding or otherwise damaging the patterned polysilicon layers 15b and 15e.

In order to provide optimal manufacturing efficiency, an in-situ Reactive Ion Etch (RIE) isotropic second etch process is preferred. It has been found experimentally that the Reactive Ion Etch (RIE) isotropic second etch process preferably employs sulfur hexafluoride (SF6) and hydrogen bromide (HBr) reactant gases. Preferably, the sulfur hexafluoride (SF6) and hydrogen bromide containing Reactive Ion Etch (RIE) isotropic second etch process is employed at a sulfur hexafluoride:hydrogen bromide volume ratio of from about 20:1 to about 2:1.

Other parameters under which is provided the sulfur hexafluoride (SF6) and hydrogen bromide (HBr) containing Reactive Ion Etch (RIE) isotropic second etch process include a reactor chamber pressure of from about 400 to about 600 mtorr, a radio frequency power of from about 100 to 180 watts, a background helium (He) flow rate of from about 45 to about 90 standard cubic centimeters per minute (sccm) and a total sulfur hexafluoride (SF6) and hydrogen bromide (HBr) flow rate of from about 150 to about 260 standard cubic centimeters per minute (sccm). The conformal polysilicon layer residues 15a, 15c, 15d and 15f are exposed to the sulfur hexafluoride (SF6) and hydrogen bromide (HBr) Reactive Ion Etch (RIE) isotropic second etch process for an etch time sufficient to completely remove the conformal polysilicon layer residues 15a, 15c, 15d and 15f. Typically, the etch time will vary dependent upon various geometric factors, including but not limited to the thickness of the blanket polysilicon layer from which is formed the conformal polysilicon layer residues 15a, 15c, 15d and 15f, and the width of the blanket substrate layer 10. Typically, etch times are in the range of about 20 to about 60 seconds.

Upon etching the conformal polysilicon layer residues 15a, 15c, 15d and 15f there is formed the structure of the first preferred embodiment of the present invention. The structure of the first preferred embodiment of the present invention has formed therein residue free patterned polysilicon layers 15b and 15e upon high step height patterned substrate layers 12a and 12b, respectively. Conformal polysilicon layer residues 15a, 15c, 15d and 15f are removed from lower step levels of the high step height patterned substrate layers 12a and 12b without over-etching, eroding or otherwise damaging the patterned polysilicon layers 15b and 15e.

In addition to the first preferred embodiment of the present invention which derives from the general structure where a patterned polysilicon layer is formed upon the surface of a high step height patterned layer, a second preferred embodiment of the present invention is also disclosed. The second preferred embodiment of the present invention derives from a more specific integrated circuit structure where a patterned polysilicon layer is formed upon the surface of a high step height patterned substrate layer which contains Field Effect Transistors (FETs) or other integrated circuit devices formed therein and there-upon. The upper surfaces of the Field Effect Transistors (FETS) or other integrated circuit devices form the upper surfaces of the high step patterned substrate layers of the second preferred embodiment of the present invention. Lower levels of the Field Effect Transistors (FETs) or other integrated circuit devices form the lower step levels of the high step height patterned substrate layers of the second preferred embodiment of the present invention. The results of progressive stages in forming residue free patterned polysilicon layers upon high step height patterned substrate layers within the integrated circuit of the second preferred embodiment of the present invention are illustrated by reference to FIG. 6 to FIG. 9.

Figure 6:
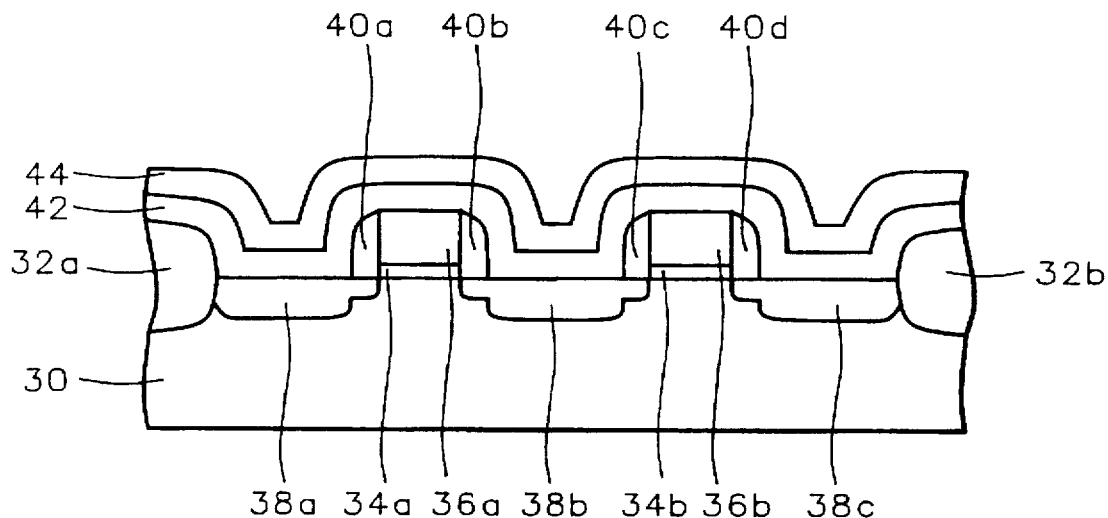
FIG. 6 to FIG. 9 show a series of schematic cross-sectional diagrams illustrating progressive stages in forming residue free patterned polysilicon layers upon high step height patterned substrate layers within an integrated circuit in accord with the second preferred embodiment of the present invention.

Shown in FIG. 6 is a semiconductor substrate 30 upon and within whose surface are formed isolation regions 32a and 32b which define the active region of the semiconductor substrate 30. Within the active region of the semiconductor substrate 30 is formed a pair of Field Effect Transistors (FETs).

The semiconductor substrate 30 upon which is practiced the second preferred embodiment of the present invention may be formed with either dopant polarity, any dopant concentration and any crystallographic orientation. Typically, the semiconductor substrate 30 upon which is practiced the second preferred embodiment of the present invention is a Si (100) semiconductor substrate of N- or P- polarity.

In general, isolation regions within and/or upon semiconductor substrates may be formed through methods including but not limited to selective thermal oxidation methods and selective oxide deposition/patterning methods. For the second preferred embodiment of the present invention, the isolation regions 32a and 32b are preferably formed through thermal oxidation of portions of the semiconductor substrate 30 exposed through a suitable mask to form isolation regions 32a and 32b of silicon oxide.

The pair of Field Effect Transistors (FETs) formed within the active region of the semiconductor substrate 30 is comprised of gate oxide layers 34a and 34b upon which reside, respectively, gate electrodes 36a and 36b. In addition to the gate oxides 34a and 34b and the gate electrodes 36a and 36b, the pair of field effect transistors also includes the source/drain electrodes 38a, 38b and 38c, and the insulator spacers 40a, 40b, 40c and 40d. The methods and materials through which all of these Field Effect Transistor (FET) components may be formed within or upon the semiconductor substrate 30 are conventional to the art.

For example, gate oxide layers may be formed through methods including but not limited to thermal oxidation methods whereby portions of semiconductor substrates are consumed to form gate oxide layers, and oxide deposition methods whereby gate oxide layers are formed from independently deposited and patterned gate oxide layer materials. Gate electrodes are typically, but not exclusively, formed via patterning through methods as are conventional in the art of blanket layers of highly conductive materials such as metals, metal alloys, highly doped polysilicon and polycides (metal silicide/polysilicon stacks). As is conventional in the art, source drain electrodes are typically formed through ion implanting suitable dopant species into the surface of a semiconductor substrate. Finally, insulator spacers are typically formed through anisotropic etching of blanket layers of insulator spacer materials formed upon semiconductor substrate surfaces. The insulator spacer materials include but are not limited to silicon oxide materials, silicon nitride materials and silicon oxynitride materials.

For the second preferred embodiment of the present invention, the gate oxide layers 34a and 34b are preferably formed to a thickness of about 40 to about 500 angstroms each through thermal oxidation of the surface of the semiconductor substrate 30. The gate electrodes 36a and 36b are preferably about 3000 to about 4000 angstroms thick each and preferably formed from either doped polysilicon or a polycide formed from alternating layers of polysilicon and tungsten silicide. The source/drain electrodes 38a, 38b and 38c are preferably formed of a low dose/low energy ion implant at about 1E13 to about 5E14 ions per square centimeter dose and about 20 to about 80 keV ion implant energy, followed by a high dose/high energy ion implant at about 5E14 to about 5E15 ions per square centimeter and about 30 to about 100 kev ion implantation energy. Between the low dose/low energy ion implant and the high dose/high energy ion implant there are formed the insulator spacers 40a, 40b, 40c and 40d, preferably through anisotropic Reactive Ion Etch (RIE) etching of a blanket layer of either a silicon oxide material or a silicon nitride material.

Also shown in FIG. 6 is the presence of two additional layers formed conformally upon the surfaces of the pair of Field Effect Transistors (FETs). The first layer is a conformal insulator layer 42 and the second layer is a conformal polysilicon layer 44. Methods and materials through which conformal insulator layers and conformal polysilicon layers may be formed upon semiconductor substrates are known in the art. Conformal insulator layers may be formed from silicon oxides or silicon oxynitrides formed upon a semiconductor substrate through methods including but not limited to Low Pressure Chemical Vapor Deposition (LPCVD) methods, Plasma Enhanced Chemical Vapor Deposition (PECVD) methods and Rapid Thermal Nitridation (RTN) (of silicon oxide) methods. Analogously, conformal polysilicon layers may be formed upon semiconductor substrates through methods including but not limited to Chemical Vapor Deposition (CVD) methods, Low Pressure Chemical Vapor Deposition (LPCVD) methods and Physical Vapor Deposition (PVD) sputtering methods.

For the second preferred embodiment of the present invention, the conformal insulator layer 42 is preferably formed of a silicon oxide material deposited upon the surface of the semiconductor substrate 30 through a Plasma Enhanced Chemical Vapor Deposition (PECVD) method. Preferably, the thickness of the conformal insulator layer 42 is from about 200 to about 2000 angstroms. For the second preferred embodiment of the present invention, the conformal polysilicon layer 44 is preferably formed of a polysilicon deposited upon the surface of the semiconductor substrate 30 through a Low Pressure Chemical Vapor Deposition (LPCVD) process. Preferably, the polysilicon within the conformal polysilicon layer 44 is made conductive through ion implanting with about 5E14 to about 2E16 dopant atoms per square centimeter. Alternatively, the dopant atoms may be incorporated in-situ as the conformal polysilicon layer 44 is formed. Preferably, the thickness of the conformal polysilicon layer 44 is from about 200 to about 4000 angstroms.

Within the second preferred embodiment of the present invention, the high step height patterned substrate layer is the top surface of the conformal insulator layer 42 over the surface of the gate electrode 36a or the gate electrode 36b. The lower step level of the high step height patterned substrate layer is the surface of the conformal insulator layer 42 over the surface of the source/drain electrode 38b. Since the conformal insulator layer 42 is a conformal insulator layer, the step height for the second preferred embodiment of the present invention is approximately equal to the thickness of the gate electrode 36a or 36b plus the thickness of the gate oxide 34a or 34b, respectively. Thus, for the second preferred embodiment of the present invention the step height is from about 3000 to about 4500 angstroms for patterned conformal polysilicon layers which terminate upon the surfaces of either of the gate electrode 36a or the gate electrode 36b. For patterned conformal polysilicon layers which terminate upon the isolation regions 32a or the isolation region 32b, the step height would include the isolation region 32a or isolation region 32b thickness above the surface of the semiconductor substrate 30, which is typically in the range of from about 2500 to about 5000 angstroms.

Figure 7:
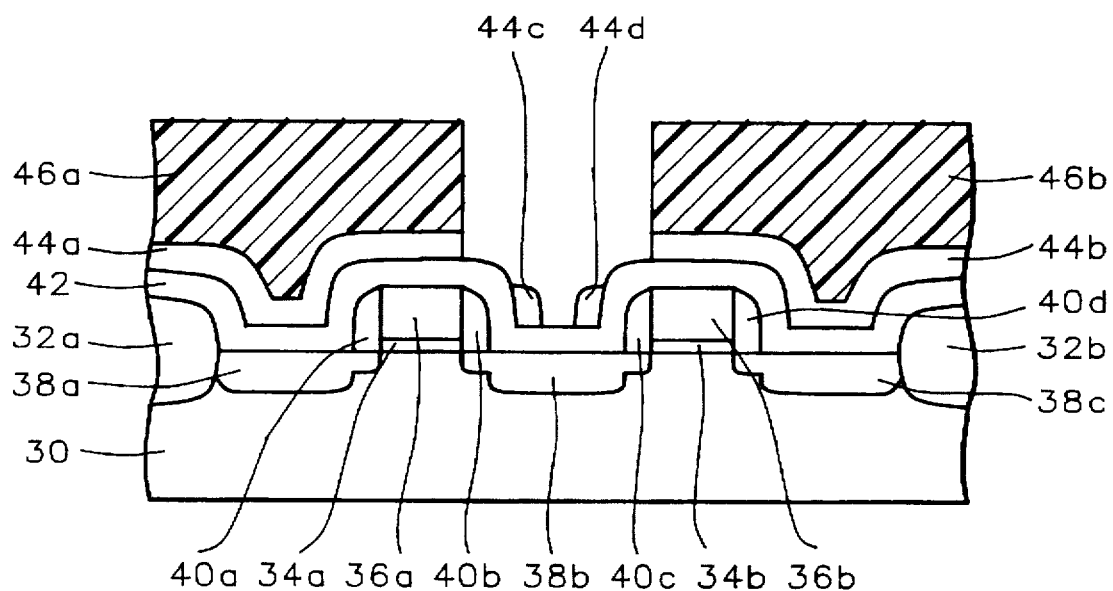

Referring now to FIG. 7, there is shown a schematic cross-sectional diagram illustrating the results of further processing of the integrated circuit whose structure is illustrated in FIG. 6. Shown in FIG. 7 is the presence of patterned photoresist layers 46a and 46b formed upon the surface of the semiconductor substrate illustrated in FIG. 6. Analogously to the first preferred embodiment of the present invention, the patterned photoresist layers 46a and 46b may be formed from any of several photoresists which are conventional in the art. Preferably, the patterned photoresist layers 46a and 46b are formed of a photoresist material which is not substantially affected by the multiple Reactive Ion Etch (RIE) etch processes to which the patterned photoresist layers 46a and 46b are exposed. Preferably, the patterned photoresist layers 46a and 46b are from about 4000 to about 30000 angstroms thick each.

As is shown in FIG. 7, the conformal polysilicon layer 44 which resides beneath the patterned photoresist layers 46a and 46b has been patterned through a Reactive Ion Etch (RIE) anisotropic first etch process to yield the patterned conformal polysilicon layers 44a and 44b. Analogously with the first preferred embodiment of the present invention the Reactive Ion Etch (RIE) anisotropic first etch process preferably contains chlorine (Cl2) and hydrogen bromide (HBr) reactant gases. The Reactive Ion Etch (RIE) anisotropic first etch process provides the desired passivation to the exposed sidewall edges of the patterned conformal polysilicon layers 44a and 44b as the patterned conformal polysilicon layers 44a and 44b are patterned from the conformal polysilicon layer 44. Preferably, the chlorine (Cl2) and hydrogen bromide (HBr) containing Reactive Ion Etch (RIE) first etch process is provided at a chlorine:hydrogen bromide volume ratio of from about 10:1 to about 2:1.

Other parameters under which is provided the chlorine (Cl2) and hydrogen bromide (HBr) containing Reactive Ion Etch (RIE) first etch process include a reactor chamber pressure of from about 220 to about 330 mtorr, a radio frequency power of from about 170 to 260 watts, a background helium (He) flow rate of from about 140 to about 250 standard cubic centimeters per minute (sccm) and a total chlorine (Cl2) and hydrogen bromide (HBr) flow rate of from about 170 to about 280 standard cubic centimeters per minute (sccm). The conformal polysilicon layer 44 from which is formed the patterned conformal polysilicon layers 44a and 44b is exposed to the chlorine (Cl2) and hydrogen bromide (HBr) Reactive Ion Etch (RIE) anisotropic first etch process for a time period sufficient to: (1) completely etch the patterned conformal polysilicon layers 44a and 44b from the conformal polysilicon layer 44, and (2) sufficiently passivate the sidewall edges of the patterned conformal polysilicon layers 44a and 44b such that the patterned conformal polysilicon layers 44a and 44b will not be over-etched, eroded or otherwise damaged within the subsequent isotropic etch step to which the patterned conformal polysilicon layers 44a and 44b will be exposed. Typically, the etch time will be from about 100 to about 180 seconds.

As also illustrated in FIG. 7, there remains after the Reactive Ion Etch (RIE) anisotropic first etch process the conformal polysilicon layer residues 44c and 44d which result from incomplete etching of the conformal polysilicon layer 44 at locations where the conformal polysilicon layer 44 adjoins the high step height vertical sidewall regions of the insulator spacers 40b and 40c. It is towards removal of the conformal polysilicon layer residues 44c and 44d without damaging the sidewall edges of the patterned conformal polysilicon layers 44a and 44b exposed beneath the patterned photoresist layers 46a and 46b that the second preferred embodiment of the present invention is directed.

Figure 8:
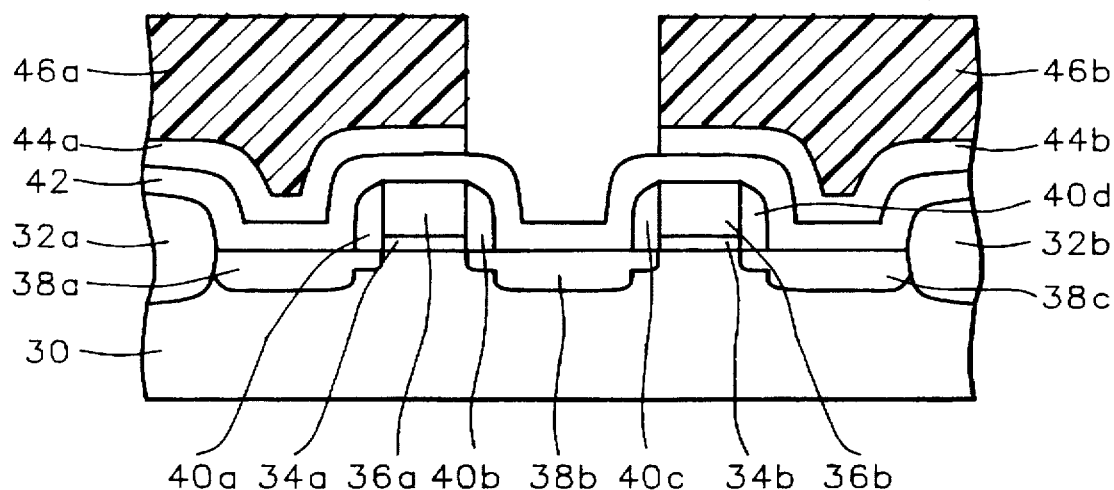

Referring now to FIG. 8 there is shown a schematic cross-sectional diagram illustrating the results of further processing of the integrated circuit whose structure is illustrated in FIG. 7. Absent from FIG. 8 are the conformal polysilicon layer residues 44c and 44d which, analogously with the first preferred embodiment of the present invention, are removed through a Reactive Ion Etch (RIE) isotropic second etch process. Also analogously with the first preferred embodiment of the present invention, the conformal polysilicon layer residues 44c and 44d are removed without over-etching, eroding or otherwise damaging the exposed sidewalls of the patterned conformal polysilicon layers 44a and 44b.

In order to provide optimal manufacturing efficiency, an in-situ Reactive Ion Etch (RIE) isotropic second etch process is preferred. It has been found experimentally that the Reactive Ion Etch (RIE) isotropic second etch process preferably employs sulfur hexafluoride (SF6) and hydrogen bromide (HBr) reactant gases. Preferably, the sulfur hexafluoride (SF6) and hydrogen bromide containing Reactive Ion Etch (RIE) isotropic second etch process is provided at a sulfur hexafluoride:hydrogen bromide volume ratio of from about 20:1 to about 2:1.

Other parameters under which is provided the sulfur hexafluoride (SF6) and hydrogen bromide (HBr) containing Reactive Ion Etch (RIE) second etch process include a reactor chamber pressure of from about 400 to about 600 mtorr, a radio frequency power of from about 100 to 180 watts, a background helium (He) flow rate of from about 45 to about 90 standard cubic centimeters per minute (sccm) and a total sulfur hexafluoride (SF6) and hydrogen bromide (HBr) flow rate of from about 150 to about 260 standard cubic centimeters per minute (sccm). The conformal polysilicon layer residues 44c and 44d are exposed to the sulfur hexafluoride (SF6) and hydrogen bromide (HBr) Reactive Ion Etch (RIE) isotropic second etch process for an etch time sufficient to completely remove the conformal polysilicon layer residues 44c and 44d. Typically, the etch time will vary dependent upon various geometric factors, including but not limited to the thickness of the blanket conformal polysilicon layer 44 and the width of the semiconductor substrate 30. Typically, etch times are in the range of about 20 to about 60 seconds.

Figure 9:
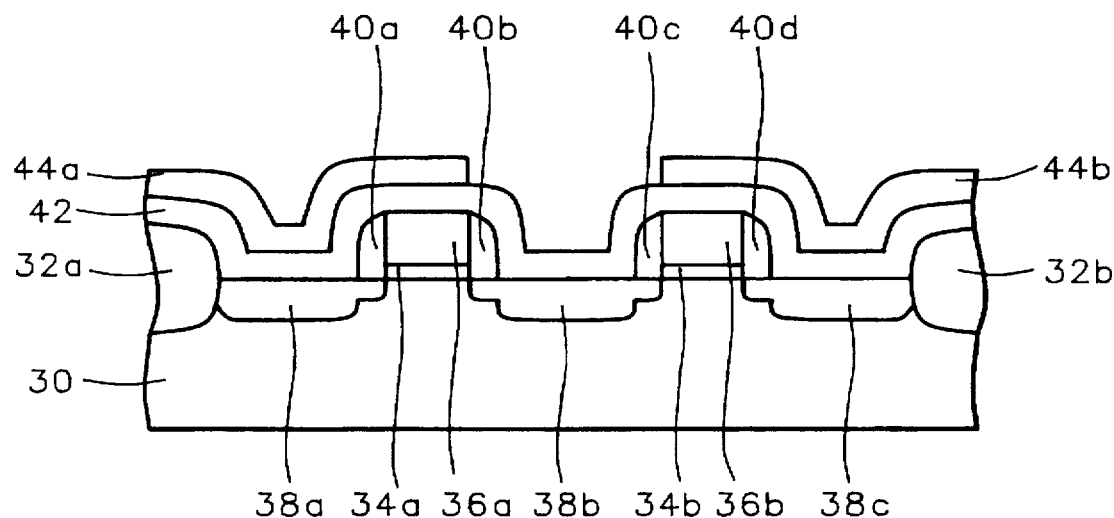

Referring now to FIG. 9, there is shown a schematic cross-sectional diagram illustrating the results of further processing of the integrated circuit whose structure is illustrated in FIG. 8. Shown in FIG. 9 is the integrated circuit structure as illustrated in FIG. 8 from which have been removed the patterned photoresist layers 46a and 46b. Methods and materials through which patterned photoresist layers may be removed from semiconductor substrates are known in the art. Such methods include but are not limited to wet chemical etch methods which employ solvents or aqueous solutions appropriate to the photoresist material, and dry plasma etch methods which typically employ oxygen as the active material to assist in removal of photoresist residues. For the second preferred embodiment of the present invention, the patterned photoresist layers 46a and 46b are preferably removed from the surface of the semiconductor substrate 30 through a dry plasma etch process employing oxygen, as is most common in the art.

Upon removing the patterned photoresist layers 46a and 46b, there is formed the integrated circuit of the second preferred embodiment of the present invention. The integrated circuit of the second preferred embodiment of the present invention has formed therein residue free patterned conformal polysilicon layers 44a and 44b upon the conformal insulator layer 42, which conformal insulator layer 42 exhibits substantial topographic variations due to underlying high step height patterned substrate layers. The upper surfaces of Field Effect Transistors (FETs) form the high step within underlying high step patterned substrate layers of the second preferred embodiment of the present invention. Conformal polysilicon layer residues are removed from lower step levels of the conformal insulator layer 42 of the second preferred embodiment of the present invention without over-etching, eroding or otherwise damaging the patterned conformal polysilicon layers 44a and 44b. Lower levels of Field Effect Transistors form the lower step levels of the underlying high step height patterned substrate layers of the second preferred embodiment of the present invention.

EXAMPLES

Formed within and upon the surface of a 6 inch silicon semiconductor substrate was an integrated circuit equivalent to the integrated circuit illustrated in FIG. 6. The integrated circuit included a pair of Field Effect Transistors (FETs), each Field Effect Transistor (FET) having a gate oxide layer of thickness about 125 angstroms, upon which was formed a gate electrode of thickness about 4000 angstroms. Upon the pair of Field Effect Transistors (FETs) was formed a conformal insulator layer of silicon oxide, through a Plasma Enhanced Chemical Vapor Deposition (PECVD) method, at a thickness of about 2000 angstroms. Upon the conformal insulator layer was formed a conformal polysilicon layer, through a Low Pressure Chemical Vapor Deposition (LPCVD) method, at a thickness of about 800 angstroms.

The 6 inch silicon semiconductor substrate was then processed further to yield an integrated circuit equivalent to the integrated circuit illustrated in FIG. 7. Formed upon the surface of the integrated circuit was formed a blanket novolak photoresist layer at a thickness of about 10000 angstroms. The blanket novolak photoresist layer was patterned to leave exposed a portion of the conformal polysilicon layer which resided between the two Field Effect Transistors (FETs).

The conformal polysilicon layer was then patterned employing the patterned novolak photoresist layer as an etch mask to yield a pair of patterned conformal polysilicon layers and a pair of conformal polysilicon layer residues equivalent to those illustrated in FIG. 7. The patterning was accomplished through a Reactive Ion Etch (RIE) anisotropic first etch process employing chlorine (Cl2) and hydrogen bromide (HBr) as reactant gases. The patterning was accomplished at a chlorine:hydrogen bromide volume ratio of about 6:1, a reactor chamber pressure of about 275 mtorr, a radio frequency power of about 215 watts, a background helium flow rate of about 180 standard cubic centimeters per minute (sccm) and a total chlorine (Cl2) and hydrogen bromide (HBr) flow rate of about 210 standard cubic centimeters per minute (sccm). The patterning was accomplished in an etch time of about 150 seconds.

The pair of conformal polysilicon layer residues was then removed through a Reactive Ion Etch (RIE) isotropic second etch process. The Reactive Ion Etch (RIE) isotropic second etch process employed sulfur hexafluoride (SF6) and hydrogen bromide (HBr) as reactant gases. The Reactive Ion Etch (RIE) isotropic second etch process was provided at a sulfur hexafluoride:hydrogen bromide volume ratio of about 12:1, a reactor chamber pressure of about 500 mtorr, a radio frequency power of about 125 watts, a background helium flow rate of about 60 standard cubic centimeters per minute (sccm), and a total sulfur hexafluoride (SF6) and hydrogen bromide (HBr) flow rate of about 190 standard cubic centimeters per minute. The etch time was about 24 seconds.

Equivalent conditions may be employed for etching an equivalent polysilicon layer within an otherwise equivalent integrated circuit formed upon an 8 inch silicon semiconductor substrate, with the exception that the sulfur hexafluoride:hydrogen bromide volume ratio within the Reactive Ion Etch (RIE) isotropic second etch process should be adjusted from 12:1 to 2:1 and the etch time should be changed from about 24 seconds to about 45 seconds.

The patterned photoresist layers were then removed and the integrated circuit was processed to completion, including the formation of additional insulator and conductor layers. The integrated circuit was then cross-sectioned and the integrity of the patterned conformal polysilicon layers was observed with the aid of an electron microscope. The patterned conformal polysilicon layers exhibited no over-etching, erosion or other damage.

For comparison purposes, a second integrated circuit was fabricated under otherwise equivalent conditions to those employed in forming the first integrated circuit, with the exception that the hydrogen bromide component of the Reactive Ion Etch (RIE) isotropic second etch process was omitted. Electron microscopic evaluation of a cross-section of the second integrated circuit showed patterned conformal polysilicon layers which were over-etched, eroded and damaged.

As is understood by a person skilled in the art, the preferred embodiments and EXAMPLES of the present invention are illustrative of the present invention rather than limiting of the present invention. Revisions to the methods, materials, structures and dimensions through which are formed the preferred embodiments and EXAMPLES of the present invention may be made while yielding additional embodiments and EXAMPLES which are within the spirit and scope of the present invention.

What is claimed is:

1. A method for forming a residue free patterned polysilicon layer upon a patterned substrate layer comprising:

providing a substrate having formed thereon a patterned substrate layer;

forming upon the patterned substrate layer a polysilicon layer;

forming upon the polysilicon layer a patterned photoresist layer, the patterned photoresist layer exposing portions of the polysilicon layer at a lower step level of the patterned substrate layer;

patterning through the patterned photoresist layer the polysilicon layer via an anisotropic first etch process to yield a patterned polysilicon layer upon an upper step level of the patterned substrate layer and polysilicon residues at the lower step level of the patterned substrate layer, the anisotropic first etch process being a Reactive Ion Etch (RIE) anisotropic first etch process which simultaneously passivates the exposed edges of the patterned polysilicon layer; and removing through an isotropic second etch process the polysilicon residues formed at the lower step level of the patterned substrate layer, the isotropic second etch process being a Reactive Ion Etch (RIE) isotropic second etch process employing a reactant gas composition comprising hydrogen bromide (HBr) and sulfur hexafluoride (SF6).

2. The method of claim 1 wherein the distance between the patterns in the patterned substrate layer is at least about 2000 angstroms.

3. The method of claim 1 wherein the step height of the patterned substrate layer is at least about 3000 angstroms.

4. The method of claim 1 wherein the thickness of the polysilicon layer is from about 200 to about 4000 angstroms.

5. The method of claim 1 wherein the thickness of the patterned photoresist layer is from about 4000 to about 30000 angstroms.

6. The method of claim 1 wherein the Reactive Ion Etch (RIE) anisotropic first etch process employs chlorine (Cl2) and hydrogen bromide (HBr) as reactant gases.

7. The method of claim 6 wherein the chlorine:hydrogen bromide volume ratio is from about 10:1 to about 2:1.

8. The method of claim 7 wherein the Reactive Ion Etch (RIE) anisotropic first etch process is employed at a radio frequency power of from about 170 to about 260 watts.

9. The method of claim 1 wherein the Reactive Ion Etch (RIE) isotropic second etch process employs a sulfur hexafluoride:hydrogen bromide volume ratio of from about 20:1 to about 2:1.

10. The method of claim 9 wherein the Reactive Ion Etch (RIE) isotropic second etch process is employed at a radio frequency power of from about 100 to about 180 watts.

11. A method for forming a residue free patterned polysilicon layer upon a patterned substrate layer within an integrated circuit comprising:

providing a semiconductor substrate having formed thereon a patterned substrate layer, the semiconductor substrate also having formed thereon a minimum of one transistor;

forming upon the patterned substrate layer a polysilicon layer;

forming upon the polysilicon layer a patterned photoresist layer, the patterned photoresist layer exposing portions of the polysilicon layer at a lower step level of the patterned substrate layer;

patterning through the patterned photoresist layer the polysilicon layer via an anisotropic first etch process to yield a patterned polysilicon layer upon an upper step level of the patterned substrate layer and polysilicon residues at the lower step level of the patterned substrate layer, the anisotropic first etch process being a Reactive Ion Etch (RIE) anisotropic first etch process which simultaneously passivates the exposed edges of the patterned polysilicon layer; and removing through an isotropic second etch process the polysilicon residues formed at the lower step level of the patterned substrate layer, the isotropic second etch process being a Reactive Ion Etch (RIE) isotropic second etch process employing a reactant gas composition comprising hydrogen bromide (HBr) and sulfur hexafluoride (SF6).

12. The method of claim 11 wherein the transistor is a Field Effect Transistor (FET).

13. The method of claim 11 wherein the distance between the patterns in the patterned substrate layer is at least about 2000 angstroms.

14. The method of claim 11 wherein the step height of the patterned substrate layer is at least about 3000 angstroms.

15. The method of claim 11 wherein the thickness of the polysilicon layer is from about 200 to about 4000 angstroms.

16. The method of claim 11 wherein the thickness of the patterned photoresist layer is from about 4000 to about 30000 angstroms.

17. The method of claim 11 wherein the Reactive Ion Etch (RIE) anisotropic first etch process employs chlorine (Cl2) and hydrogen bromide (HBr) as reactant gases.

18. The method of claim 17 wherein the chlorine:hydrogen bromide volume ratio is from about 10:1 to about 2:1.

19. The method of claim 18 wherein the Reactive Ion Etch (RIE) anisotropic first etch process is employed at a radio frequency power of from about 170 to about 260 watts.

20. The method of claim 11 wherein the Reactive Ion Etch (RIE) isotropic second etch process employs a sulfur hexafluoride:hydrogen bromide volume ratio of from about 20:1 to about 2:1.

21. The method of claim 20 wherein the Reactive Ion Etch (RIE) isotropic second etch process is employed at a radio frequency power of from about 100 to about 180 watts.

22. The method of claim 11 further comprising forming an insulator layer upon the patterned substrate layer immediately beneath the polysilicon layer.

23. The method of claim 22 wherein the insulator layer is a silicon oxide insulator layer at a thickness of from about 200 to about 2000 angstroms.

* * * * *